United States Patent
Kern

(10) Patent No.: US 8,254,178 B2
(45) Date of Patent: Aug. 28, 2012

(54) SELF-TIMED INTEGRATING DIFFERENTIAL CURRENT

(75) Inventor: Thomas Kern, Munich (DE)

(73) Assignee: Infineon Technologies AG, Neubiberg (DE)

( * ) Notice: Subject to any disclaimer, the term of this patent is extended or adjusted under 35 U.S.C. 154(b) by 247 days.

(21) Appl. No.: 12/826,875

(22) Filed: Jun. 30, 2010

(65) Prior Publication Data

US 2010/0265783 A1 Oct. 21, 2010

Related U.S. Application Data

(63) Continuation-in-part of application No. 11/845,534, filed on Aug. 27, 2007, now Pat. No. 7,782,678.

(51) Int. Cl.
*G11C 16/06* (2006.01)
(52) U.S. Cl. ............... 365/185.21; 365/189.07; 365/207
(58) Field of Classification Search ............. 365/185.21, 365/189.07, 207
See application file for complete search history.

(56) References Cited

U.S. PATENT DOCUMENTS

| | | | |
|---|---|---|---|
| 4,713,797 A | 12/1987 | Morton et al. | |
| 5,191,555 A * | 3/1993 | Tabacco et al. | 365/230.08 |
| 5,712,815 A | 1/1998 | Bill et al. | |
| 5,999,454 A | 12/1999 | Smith | |
| 6,044,019 A | 3/2000 | Cernea et al. | |
| 6,272,049 B1 | 8/2001 | Maruyama et al. | |
| 6,411,557 B2 | 6/2002 | Terzioglu et al. | |
| 6,707,717 B2 | 3/2004 | Jun-Lin | |
| 6,813,209 B2 | 11/2004 | Crain et al. | |
| 7,088,630 B2 | 8/2006 | Hung et al. | |
| 2002/0009009 A1* | 1/2002 | Ahmed et al. | 365/207 |
| 2002/0060944 A1* | 5/2002 | Noda et al. | 365/227 |
| 2003/0169622 A1 | 9/2003 | Ooishi et al. | |
| 2004/0034440 A1 | 2/2004 | Middlebrook | |
| 2004/0120200 A1 | 6/2004 | Gogl et al. | |
| 2004/0136255 A1 | 7/2004 | Crain et al. | |
| 2005/0036395 A1 | 2/2005 | Maejima et al. | |
| 2006/0126389 A1 | 6/2006 | Sarig | |
| 2008/0273394 A1 | 11/2008 | Kern | |
| 2009/0059672 A1 | 3/2009 | Kern | |

OTHER PUBLICATIONS

Office Action dated Jul. 23, 2009 issued to US Patent Publication No. 20090059672.
Response to Office Action dated Jul. 23, 2009 issued to US Patent Publication No. 20090059672.
Notice of Allowance dated Dec. 16, 2009 issued to US Patent Publication No. 20090059672.
Office Action dated Oct. 15, 2008 issued to US Patent Publication No. 20080273394.
Response to Office Action dated Oct. 15, 2008 issued to US Patent Publication No. 20080273394.
Office Action dated Jan. 14, 2009 issued to US Patent Publication No. 20080273394.
Office Action dated Jul. 22, 2009 issued to US Patent Publication No. 20080273394. Office Action dated Jan. 29, 2010 issued to US Patent Publication No. 20080273394.
Notice of Allowance dated May 24, 2010 issued to US Patent Publication No. 20080273394.

* cited by examiner

*Primary Examiner* — Tuan T. Nguyen
(74) *Attorney, Agent, or Firm* — Eschweiler & Associates, LLC

(57) ABSTRACT

A reference current integrator and a sensed current integrator are coupled to form a differential sense amplifier. The differential sense amplifier is coupled to receive a bitline current signal from a flash memory, and the reference current integrator is coupled to receive a current signal from a reference memory cell. Integration continues until a desired voltage or time is reached, resulting in a sufficiently reliable output. The differential current integrating sense amplifier is also used for instrumentation, communication, data storage, sensing, biomedical device, and analog to digital conversion.

12 Claims, 6 Drawing Sheets

US 8,254,178 B2

SELF-TIMED INTEGRATING DIFFERENTIAL CURRENT

REFERENCE TO RELATED APPLICATION

This application is a Continuation-in-part to U.S. patent application Ser. No. 11/845,534 which was filed Aug. 27, 2007, entitled SELF-TIMED INTEGRATING DIFFERENTIAL CURRENT SENSE AMPLIFIER, the entirety of which is hereby incorporated by reference as if fully set forth herein.

FIELD OF THE INVENTION

The invention relates generally to electronic amplifier circuits, and more specifically in one embodiment to a self-timed integrating symmetric differential current sense amplifier.

BACKGROUND

Memory cells in computers and other electronic devices typically store information by storing a charge in a transistor or other circuit or component, such that the cell can be read by examining the charge in the cell. Traditional dynamic random access memory is arranged in rows and columns of memory cells that use a transistor and a capacitor at each memory cell location, such that the transistor is used to selectively charge the capacitor and store data. Reading data comprises selecting a column using a column access signal and reading the charge present in each cell in a selected row of capacitive memory cells.

While dynamic memory loses its data when it is powered off, nonvolatile memory such as flash memory retains its data once programmed. Flash memory comprises a number of independent cells, each of which typically comprises a single transistor and stores a single binary digit or bit of information. In variations, multiple transistors or multiple bits of information per cell are used. A typical flash memory or nonvolatile memory cell resembles a field effect transistor, but has an electrically isolated floating gate that controls or influences electrical conduction between source and drain regions of the memory cell. Data is represented by a charge stored on the floating gate, and the resulting conductivity observed between the source and drain regions during a read operation as a result of a change in the cell's threshold voltage.

The floating gate separates a second gate from the source and drain regions of the memory cell, which is called the control gate. Electrons stored on the floating gate insulated from the control gate and the drain and source by an insulating oxide layer partially cancel out or modify an electric field produced by the control gate, resulting in a change in the effective threshold voltage (Vt) of the memory cell. When the memory cell is read by placing a specified voltage on the control gate, current will either flow or not flow between the source and drain of the device, depending on the presence of a charge on the floating gate and the effective Vt or threshold voltage of the memory cell. The presence or absence of current above a threshold level is sensed in a sense amplifier, and is used to determine the state of the memory cell, resulting in a one or zero value being read.

But, as memory cells become increasingly smaller and the speed with which they operate becomes increasingly faster, factors such as capacitance can cause the observed difference in current flow between a flash memory cell with a charged floating gate and a flash memory cell with an uncharged floating gate to be very small. The decreased cell current at higher densities and larger capacitive loads on the bitline in particular can make it difficult to determine a memory cell's state quickly and reliably. Sense amplifiers can have a difficult time detecting currents that are in the microamp range, especially in applications that operate at high speeds, low voltages and currents, and using very small semiconductor device sizes.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the invention, which is defined only by the appended claims.

Figure 1:
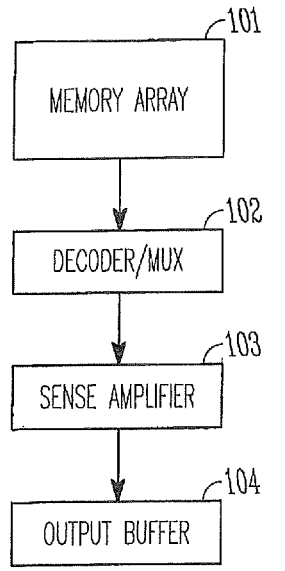
FIG. 1 illustrates a block diagram of a memory device, as may be used to practice various embodiments of the invention.

FIG. 1 is a block diagram of a flash memory, as may be used to practice some embodiments of the invention. The memory includes an array of flash memory elements at 101, which is accessed via a decoder/multiplexer 102 and coupled to a sense amplifier 103 and an output buffer or latch 104. In operation, the flash memory elements are selected by coupling the elements being read to bitlines via the decoder/multiplexer 102, which are in turn coupled to the sense amplifier 103. The sensed state of each bit being read is then latched or buffered in the output buffer 104.

Figure 2:
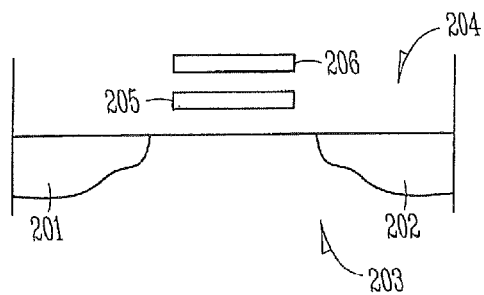
FIG. 2 illustrates a flash memory cell, as may be used to practice various embodiments of the invention.

A typical flash memory cell is illustrated in FIG. 2. A source 201 and drain 202 are formed on a substrate 203, where the substrate is made of a p-type or n-type semiconductor material. The source, drain, and substrate are in some embodiments formed of silicon, with a dopant having five valence electrons such as phosphorous, arsenic, or antimony to increase the electron concentration in the silicon or with a dopant having three valence electrons such as boron, gallium, indium, or aluminum to increase the hole concentration. Dopants are added in small, controlled quantities to produce the desired hole or electron concentration in the semiconductor material, resulting in n-type material if a surplus of electrons are present, such as in the source 201 and drain 202, and resulting on p-type material if an excess of holes are present such as in the substrate material 203.

An insulator material such as silicon oxide (SiO2) is used to form an insulating layer 204, which has embedded within it a floating gate 205, fabricated from a conductor such as metal or polysilicon, and a control gate 206 similarly formed of a conductive material. In some embodiments, the oxide 204 separating the floating gate 205 from the substrate material 203 is a high-quality oxide grown separately from the rest of the oxide 204. The floating gate is not directly electrically coupled to another conductive element of the memory cell, but is "floating" in the insulating material 204. In an alternate example, the gate 205 is electrically DC coupled to a control line. Here, the floating gate is separated from the region of the p-type substrate material 203 between the source 201 and the drain 202 by a thin insulating layer of controlled thickness, such as one hundred angstroms.

In operation, the floating gate 205 is able to store a charge due to its electrical isolation from other components of the memory cell. Setting or erasing a charge level on the floating gate 205 is performed in some embodiments such as NAND memory arrays via a tunneling process known as Fowler-Nordheim tunneling, in which electrons tunnel through the oxide layer separating the floating gate 205 from the substrate 203. In other example such as a NOR flash array, charging the floating gate is performed via a channel hot electron (CHE) method in which high voltage is applied between the gate and drain to increase the energy of the electrons that pass through the channel. Most flash memory cells are categorized as NOR flash or NAND flash, based on the circuitry used to perform write, read, and erase operations.

To write a bit to a NOR flash memory cell or store a charge on its floating gate using the channel hot electron method, the source 201 is grounded and a supply voltage such as six volts is applied to the drain 202, creating a pinch-off condition at the drain side of the substrate channel 203. In one embodiment, the drain voltage is applied via a bitline used to identify the bit to be written. A higher voltage such as 12 volts is also placed on the control gate 206, forcing an inversion region to form in the p-type substrate due to the attraction of electrons to the positively charged control gate. The voltage difference between the source and drain in combination with the inversion region in the p-type material result in significant electron flow between the source 201 and drain 202 through the p-type substrate 203's inversion region, such that the kinetic energy of the electrons and the electric field generated by the control gate voltage at 206 result in transfer of high-energy or "hot" electrons across the insulator and onto the floating gate 205. The current that flows between the source and drain is proportional to the number of electrons that become "hot", such that the number of "hot" electrons is the product of the current flow and the hot electron efficiency of the gate.

NOR and NAND flash memory can also be written and erased via Fowler-Nordheim tunneling. In one example of programming a cell via Fowler-Nordheim tunneling, the source 201 and drain 202 are grounded while the control gate is brought up to a high voltage of perhaps 20 volts. This higher gate voltage is needed in the absence of "hot" electrons flowing between the source and drain of the memory cell to cause tunneling of electrons from the substrate channel 103 or the source or drain through the insulator 204 onto the floating gate 205. The electrons that tunnel through the insulating oxide region via this Fowler-Nordheim (F-N) mechanism result in a negative electric field in the vicinity of the floating gate.

The floating gate thereby adopts a negative charge that counteracts any control gate positive charge's effect on the region of the substrate 203 between the source 201 and drain 202, raising the memory cell's threshold voltage that must be applied to the wordline to result in conduction across an inversion region in the p-type substrate material 203. In other words, when the wordline's voltage is brought to a logic 1 or high voltage such as five volts during a read operation, the cell will not turn on due to the higher threshold voltage as a result of electrons stored on the floating gate 105 during the write operation. The read voltage applied to the control gate is larger than the threshold voltage (Vt) of an erased memory cell, but not large enough to allow conduction across a substrate 203 inversion region of a cell that has been written.

Figure 3:
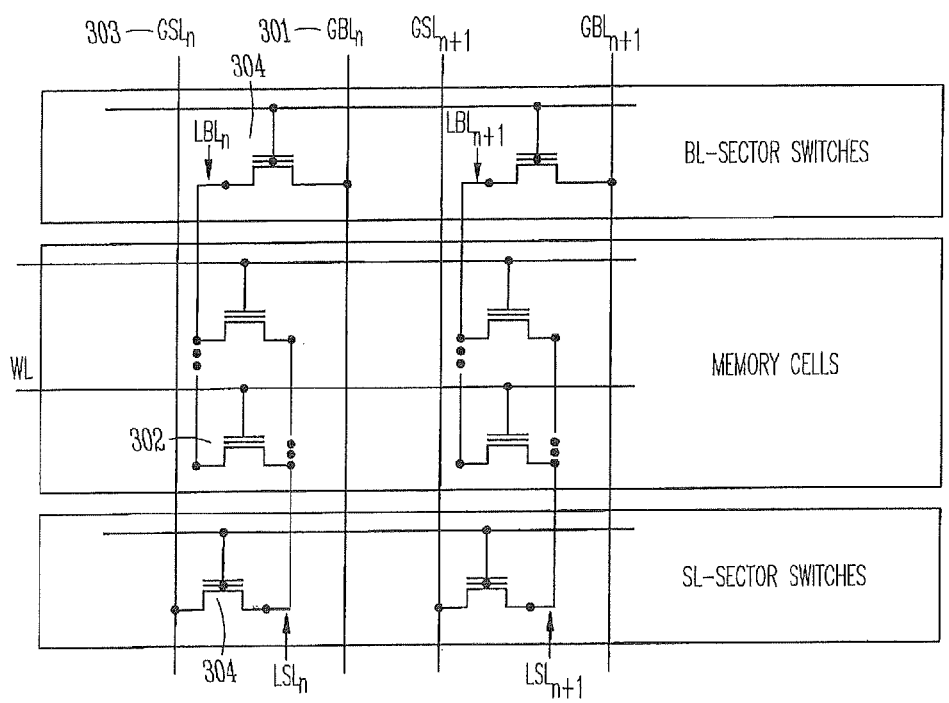
FIG. 3 is a schematic diagram of a portion of a flash memory array, as may be used to practice various embodiments of the invention.

Memory cells such as that of FIG. 2 are typically arranged in arrays that are addressed via wordlines and bitlines, as shown in FIG. 3. FIG. 3 shows a portion of an AND flash memory array, where each of the memory cells shown is addressable via a bitline and a wordline.

The bitline 301 is coupled to a series of floating gate memory cells 302, such as a parallel string of 32 memory cells. The series of memory cells are connected on the other side of the series to source line 303, and can be selectively isolated from the source line 303 and bitline 301 by line select transistors 304.

The memory cells are written in one example by providing appropriate voltages on the source and bit lines of the row of the cell to be programmed, and by applying the appropriate voltage to the wordline of the cell to be programmed. To perform a read operation, the wordline of the selected cell is brought high while a sense amplifier checks for conduction of a signal across the source and bitlines of the parallel string of cells including the cell selected via the wordline. In one more detailed example, a voltage applied at the source line is conducted to the wordline upon application of a read voltage to the wordline of the cell being read only if the cell is not programmed.

The sense amplifier 102 of FIG. 1 comprises in one embodiment a number of separate amplifiers coupled to the various bitlines of a memory array such as that of FIG. 3, such that the individual sense amplifier elements are used to amplify the current flow that can be observed on the bitlines. When the flash memory is operating at low voltages, high speed, and using very small cell geometry, the current flowing can be relatively small, and the current flow difference between a programmed and an unprogrammed flash memory cell can be difficult to detect quickly and reliably.

Some systems sense amplifiers solve this problem by using an integrator circuit, which accumulates a charge from the received current flow over a period of time so that the accumulated current over the specific period of time indicates the average current flow level during integration. The integrator is typically set to run for a period of time sufficient to accumulate enough charge to reliably indicate the level of current flow, such as to reliably read the state of a memory bit by accumulating current flowing into the integrator via the memory array bitline. The period of time is often controlled by a clock signal, such as a system clock, as is shown in the prior art example of FIG. 4.

Figure 4:
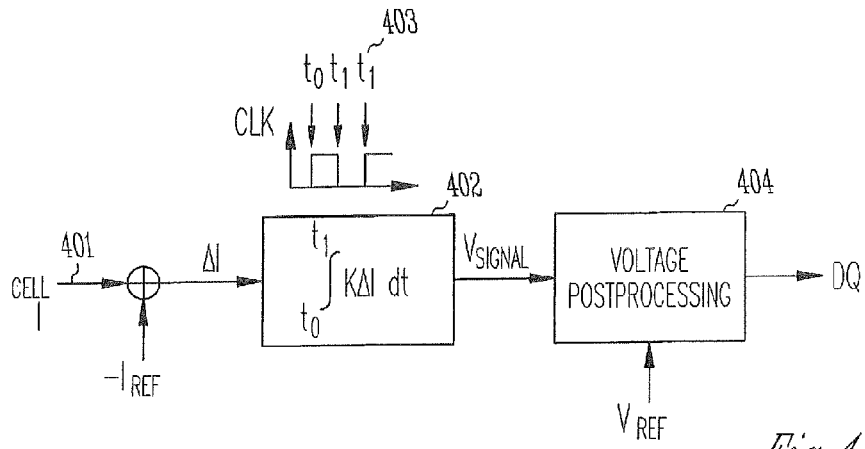
FIG. 4 is a block diagram of a memory cell read amplifier, consistent with the prior art.

FIG. 4 shows an integrator circuit, consistent with the prior art. A cell current 401 flows into an integrator circuit 402, where the current is accumulated over a period of time determined by system clock 403. The integrator 402 starts accumulating charge at a certain point in the system clock, and runs for a number of clock transitions such as three cycles before integration is complete and the accumulated charge is processed in voltage postprocessing module 404 to determine whether the memory cell being read is programmed or unprogrammed. This approach has certain disadvantages, including time being defined in minimum units of half a clock period and reliance on a system clock that may introduce some timing variance of its own into a memory read cycle.

One example embodiment of the invention therefore provides a self-timed integrating circuit, such as may be used to read a memory cell's state or to perform other integrating functions. This provides better control over the integration time, resulting in potentially faster determination of the signal level being integrated and better overall system performance.

Figure 5:
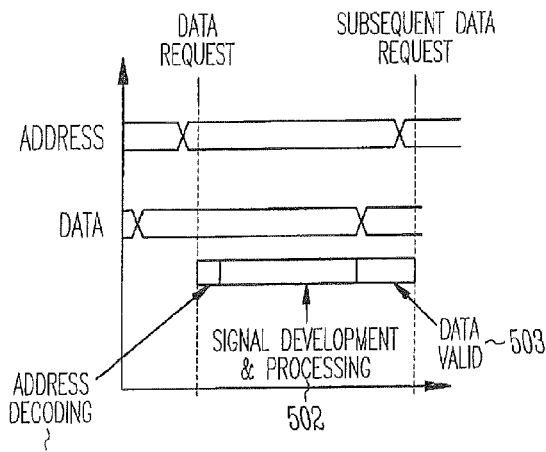
FIG. 5 is a timing diagram illustrating a flash memory read cycle, consistent with an example embodiment of the invention.

FIG. 5 shows a timing diagram, illustrating a flash memory read cycle consistent with an example embodiment of the invention. The diagram illustrates a typical data read phase, including address decoding 501, signal development and processing 502, and data processing or latching 503. The diagram illustrates in relative terms that signal accumulation in the integrator the most time-consuming part of the memory cell read process, due to the relatively low input currents received from the memory cell being read via the bitline. This shows why management of the signal development time is useful in reducing or minimizing the overall read time, and in improving system performance.

Figure 6:
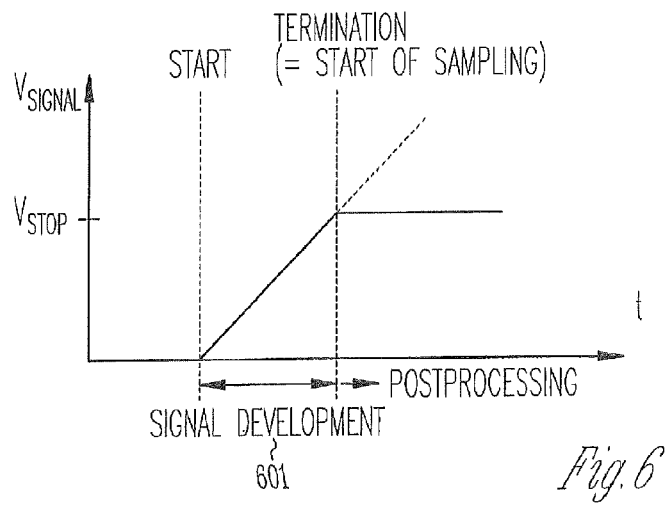
FIG. 6 is a voltage v. time diagram illustrating self-timing in a read sense amplifier, consistent with an example embodiment of the invention.

FIG. 6 is a timing diagram showing operation of a self-timed integrating sense amplifier, consistent with an example embodiment of the invention. In this example, a reference cell current is available to the integrator, and is integrated in the integrating sense amplifier circuit until a certain reference voltage is reached. In this example, integration starts at the beginning of the signal development stage 601, and continues until the reference voltage Vstop is reached. Reaching the reference voltage defines the end of the signal development stage, and the time taken for the signal development stage 601 is the time used to integrate bitline signals from the memory cell to determine the state of the cell being read. This system and method provide reliable determination of the sense amplifier integrating time needed to produce the desired output signal, and to reliably read the state of a memory cell or another low current signal.

The reference voltage Vstop is determined using various criteria in various embodiments of the invention, including ensuring sufficient signal development in the integrator circuit and providing a suitable signal for the post-processing circuit that uses the integrated signal to determine the memory cell's programmed or unprogrammed state.

Figure 7:
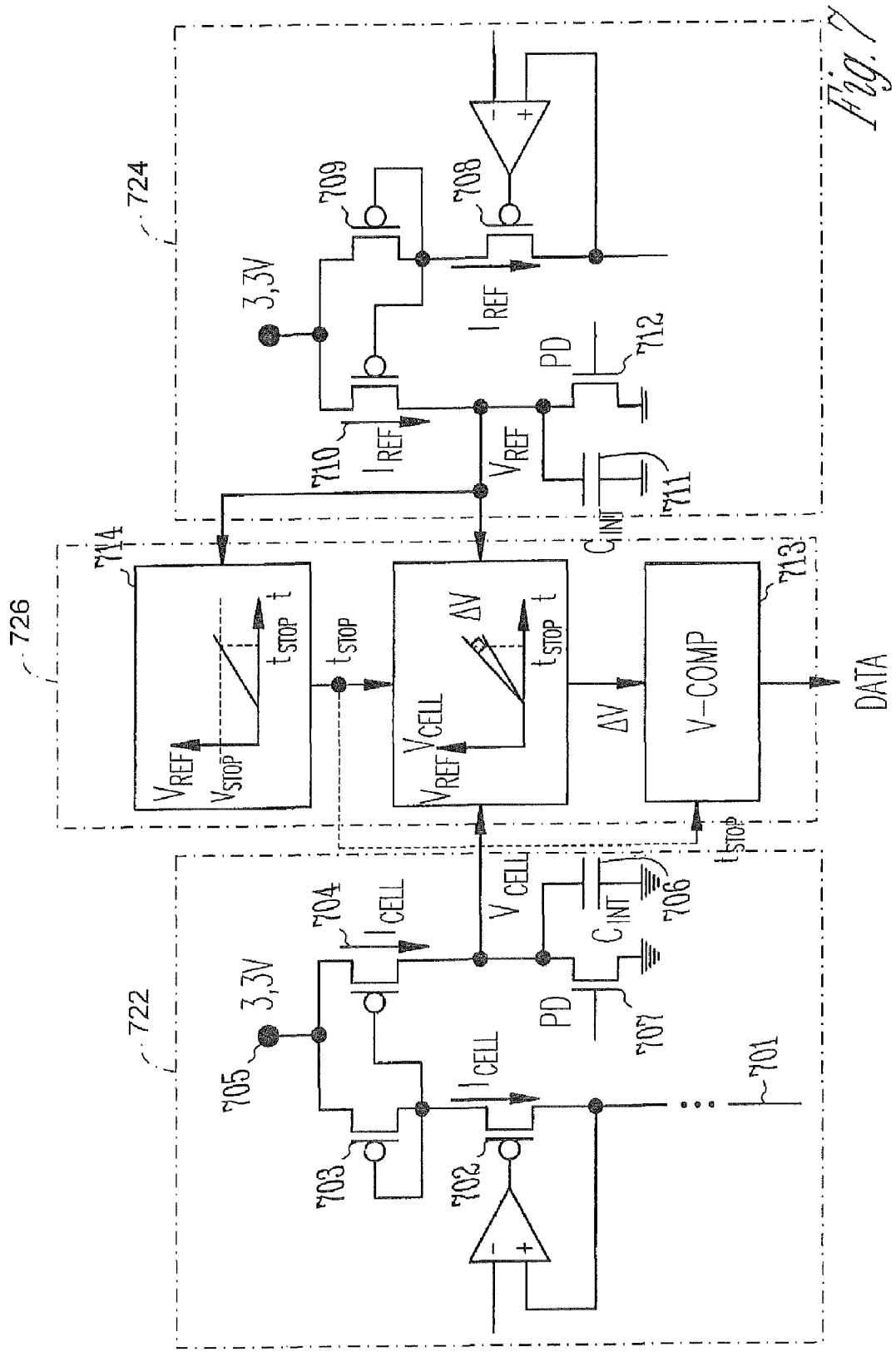
FIG. 7 is a schematic diagram of a self-timed differential integrating sense amplifier, consistent with an example embodiment of the invention.

FIG. 7 shows a schematic diagram of a self-timed integrating differential sense amplifier, which includes first circuit 722 and a second circuit 724 consistent with an example embodiment of the invention. The first circuit 722 has an input connected to an input of the sense amplifier (e.g., connected to a bitline of a memory cell to be interrogated) and provides a first time varying voltage signal indicative of a data state stored in the cell. The second circuit 724 provides a second time-varying voltage signal indicative of an intermediate data state. The differential sense amplifier also includes a comparator 726 operable to compare the first and second time-varying voltage signals to determine the data state stored in the memory cell. In some implementations, the comparator 726 includes a self-timed circuit to determine a time during which the first and second voltage signals are compared.

The current flowing in the bitline of the memory cell being read is coupled to the circuit at 701, and draws current down through transistor 702. Transistors 703 and 704 are coupled to a voltage supply 705, and form a current mirror. The mirrored cell current is integrated in integrating capacitor 706, which is reset to having no charge before each integration cycle by discharge transistor 707.

On the other side of the circuit, a reference cell current transistor 708 is coupled to a reference cell and conducts the reference cell current, where the reference cell conducts at the threshold between a programmed and unprogrammed flash memory cell. Transistors 709 and 710 form a current mirror, mirroring the reference cell current to integrating capacitor 711. The integrating capacitor is reset to having no charge between read operations by discharge transistor 712, which in some embodiments is controlled by the same discharge signal as integrator discharge transistor 707 to ensure uniformity in charge/discharge characteristics between integrating circuits.

The circuit of FIG. 7 integrates the memory cell current observed on the bitline 701 in the left portion of the circuit, and integrates the current flowing through a reference cell in the right portion of the circuit. The reference cell is configured to conduct at the threshold value between a programmed and an unprogrammed state, and sets the reference or threshold value for determining the state of other memory cells. The reference cell's current Iref is mirrored via the current mirror formed by transistors 708, 709, and 710, such that the reference cell's conducted current level is reflected in transistor 710. This current is also integrated in an integrator formed by capacitor 711 and transistor 712, such that the capacitor accumulates the current flowing as Iref through transistor 710. The capacitance of transistor 712 is part of the integrating capacitance, but is typically negligible relative to the capacitance of the integrating capacitor 711.

As time passes, the difference between the voltage accumulated in the integrating capacitor 711 from the reference cell current and the voltage accumulated in the integrating capacitor 706 from the memory cell current becomes more evident, and can be used in a comparator circuit 713 to determine the state of the memory cell being read. But, the question remains as to how long to let the integrating capacitors accumulate charge before a reliable evaluation can be made. If the time selected is too short, the validity of the integrator comparison will not be reliable, and if the time selected is longer than needed the memory cell read time is needlessly lengthened, resulting in poor memory performance.

This example embodiment of the invention therefore uses an accumulated voltage tracking circuit 714, which may also be referred to as a trigger circuit in some embodiments, to track the voltage accumulated in at least one of the reference integrating capacitor 711 and the memory cell capacitor 706, and stops the integration portion of the read cycle when a predetermined stop voltage is reached. In one such example, the voltage tracking circuit 714 tracks the voltage accumulated on the integrating capacitor 711 until the voltage reaches the stop voltage as shown and discussed in conjunction with FIG. 6. The respective voltages from the integrating capacitor 711 and the integrating capacitor 706 are then fed to the comparator, which generates a digital output signal that depends on which integrating capacitor accumulated a larger voltage during the integrating period. The output signal from the comparator 713 is latched, and provided as the detected output state of the memory cell being read.

Accuracy of the accumulated integration voltage is dependent not only on having very similar transistor and capacitor characteristics, but also on other factors such as equalization of the capacitor voltages before integration begins. This can be achieved in some embodiments via an equalizer circuit (not pictured) that is operable to couple the capacitors to one another or to couple them so that the same potential is across each capacitor before integration begins. In one example embodiment, transistors 707 and 712 are turned on until integration begins, effectively coupling both terminals of both capacitors 706 and 711 to ground so that no charge is stored in the capacitors.

Capacitor characteristics such as equivalent series resistance and equivalent series inductance can also influence the response of the capacitor. Minimizing these parameters helps the capacitor receive a charge more efficiently, but matching these parameters between the two capacitors is perhaps more important in that it ensures the capacitors will charge at equal rates if exposed to the same circuit conditions. Other capacitor parameters such as dielectric absorption can be problematic to some degree in very sensitive applications, in that dielectric absorption causes a capacitor to retain some charge in its dielectric material even after the capacitor has been discharged. If capacitors 706 and 711 have significant dielectric absorption, the equalization or discharge process may not actually result in the capacitors both having no charge if one capacitor has retained some small charge due to dielectric absorption and the other capacitor has not.

Capacitors can also change capacitance, equivalent series resistance, or other characteristics as the temperature of the capacitor changes. Thermal change in capacitor characteristics is not uncommon in semiconductor devices as the semiconductor device operates and the substrate or die on which the circuit is formed heats up. Although a small change in characteristics may be tolerated if the change appears equally in both the reference capacitor 711 and the cell current capacitor 706, differences in characteristics between the capacitors is undesirable. The capacitors are therefore desirably built near each other, such as on the same integrated circuit or substrate, using the same semiconductor processes. Ensuring that the parameters of the capacitors are closely matched will result in being able to accurately accumulate current flow from the respective current mirrors of FIG. 7 very quickly, and result in a very fast useful result.

Similarly, the characteristics of the reference cell are desirably similar to the characteristics of the memory cells in the flash memory array. In one example embodiment, the reference cell is a memory cell that is programmed to an intermediate or semi-programmed state, and defines the threshold above or below which other memory cells will be considered to be programmed or unprogrammed. Here, the threshold voltage for the reference cell is located between the threshold voltages for the erased cells and the programmed cells to provide fast and accurate determination of whether a cell is programmed or unprogrammed.

Figure 8:
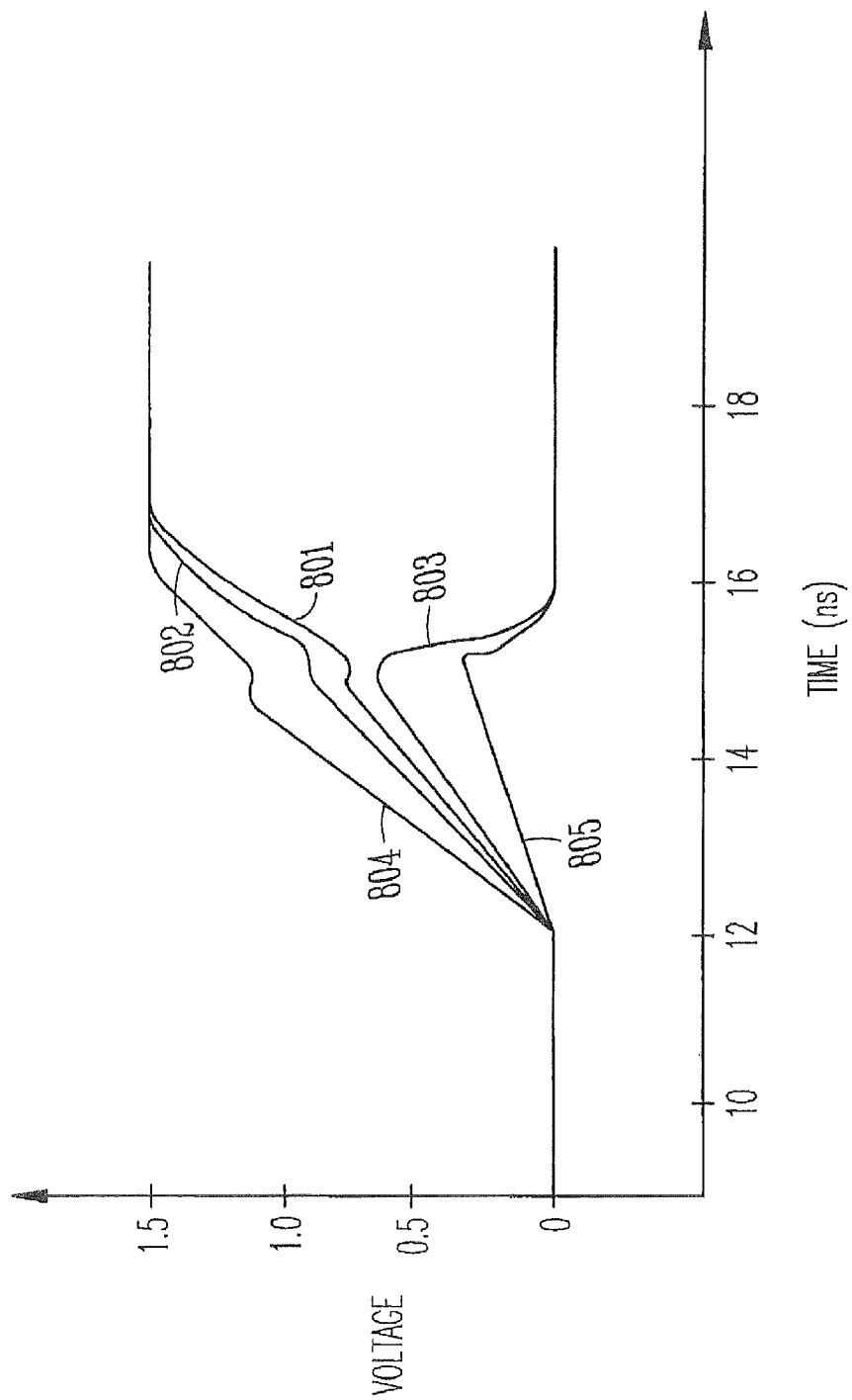
FIG. 8 illustrates the integrating capacitor voltage in response to the reference cell current Iref and various programmed and unprogrammed memory cell currents Icell, consistent with an example embodiment of the invention.

In one more detailed example, a stop voltage of approximately 0.7 volts is set based on an anticipated reference cell current of approximately ten microamps and a differential current of plus or minus one microamp for a programmed or unprogrammed reference cell, as shown in FIG. 8. In this graph, curve 801 shows how the integrating capacitor 711 of FIG. 7 increases over time, as a current of approximately ten microamps flows through the reference cell and is mirrored by the current mirror as Iref. In an embodiment where a difference of plus or minus one microamp is observed between a programmed cell and an unprogrammed cell relative to the reference cell, the difference in voltage accumulated in the reference integrating capacitor 711 and the programmed or unprogrammed cells will be increasingly evident over time, as shown by curves 802 and 803.

Curve 802 represents the voltage observed in the cell current integrating capacitor 707 at a memory cell bitline current of one microamp greater than the reference cell current, which is in this example a bitline current of 11 microamps relative to a reference cell current of ten microamps. The difference in accumulated voltage in the reference cell integrating capacitor 711 and the memory cell integrating capacitor 707 exceeds 50 mv after approximately three nanoseconds, at which point the difference between the voltages observed in the comparator at 713 can be safely read as the state of the memory cell being read. Other examples use an accumulated voltage difference greater or smaller than 50 mv, typically resulting in a different stop voltage than the approximately 0.7 volts of this example and a correspondingly different integration time.

In another example in which the difference between the unprogrammed and programmed memory cell currents is plus or minus 7 microamps relative to the reference cell current of ten microamps, a usable output voltage difference of greater than the 50 mv desired in this example becomes available after only a fraction of a nanosecond. The voltage accumulated in the memory cell integrating capacitor when the memory cell is in a programmed state and conducting 17 microamps is shown in curve 804, and the voltage accumulated in the memory cell integrating capacitor when the memory cell is in an unprogrammed state and conducts only three microamps is shown in curve 805. Both of these curves diverge very quickly from the voltage seen across the integrating capacitor as shown in curve 801, enabling fast and accurate detection of the state of the memory cell with an integrating time of a fraction of a nanosecond and a stop voltage of approximately 0.2 volts.

Figure 9:
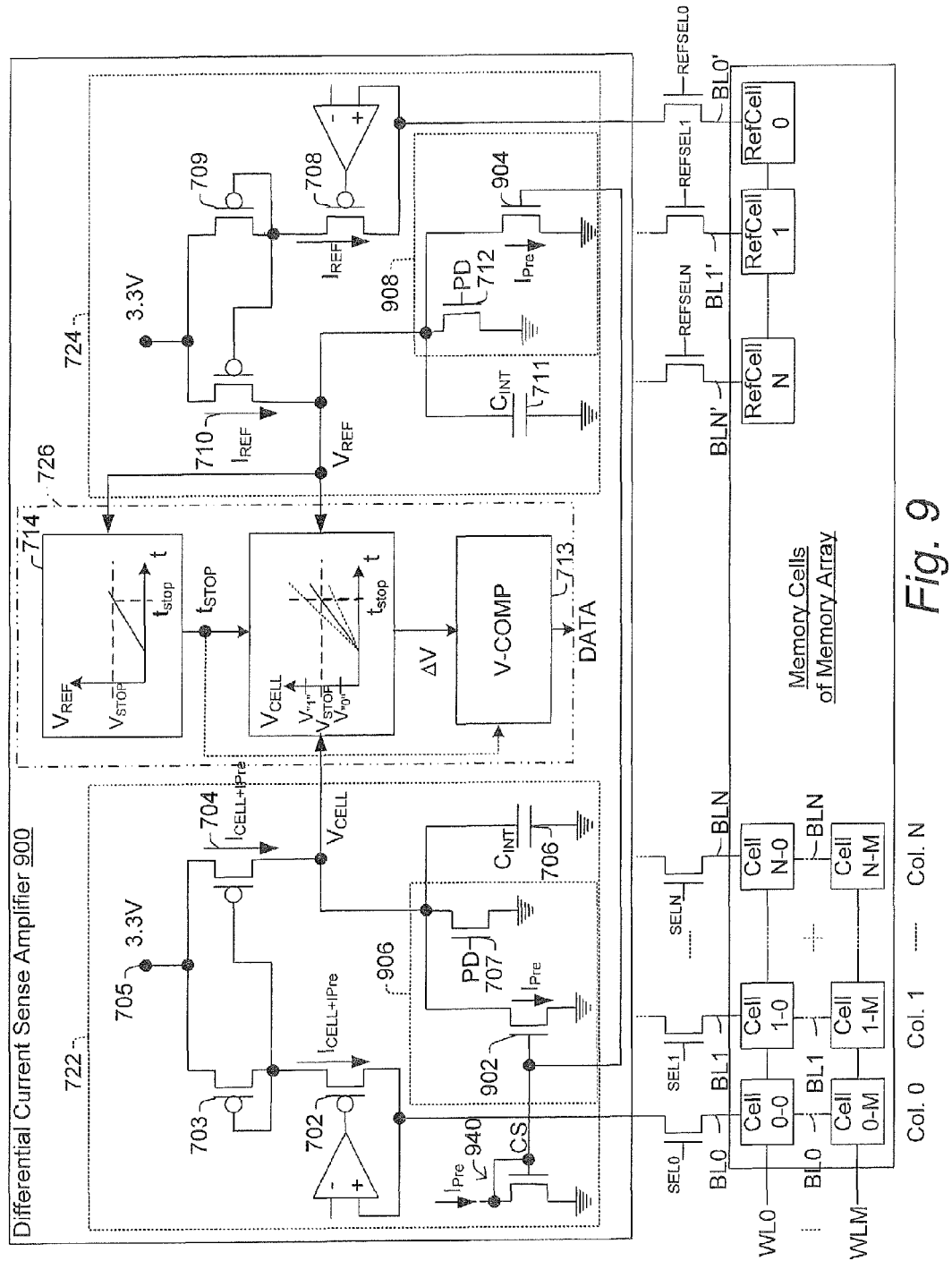
FIG. 9 illustrates a schematic diagram of a self-timed differential integrating sense amplifier, consistent with an example embodiment of the invention
Figure 10:
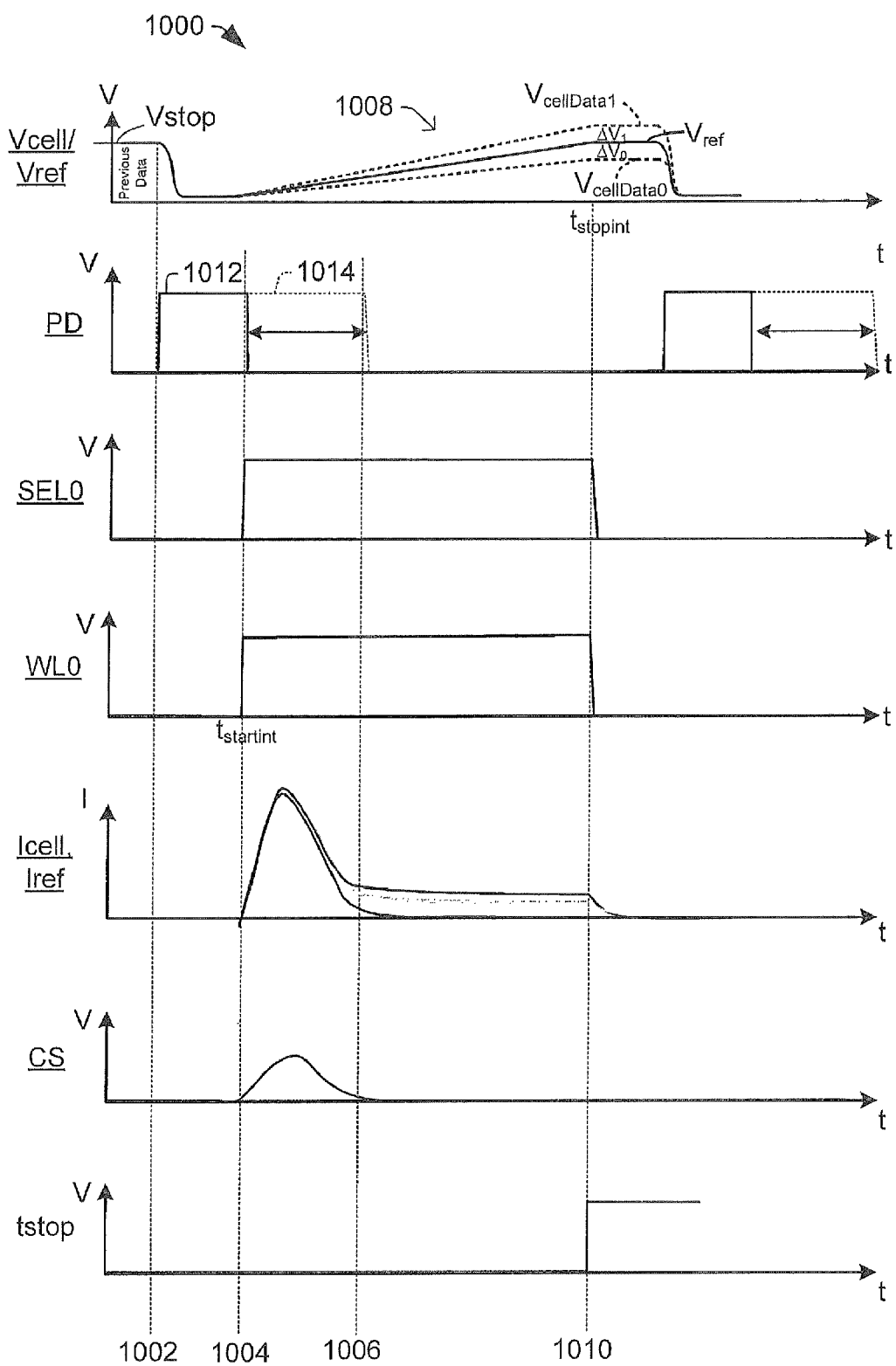
FIG. 10 illustrates an example timing diagram discussed with respect to an embodiment consistent with FIG. 9's embodiment.

Referring now to FIGS. 9-10, one can see another embodiment according to some aspects of this disclosure. FIG. 9 shows another circuit schematic for a self-timed integrating differential current amplifier 900, wherein elements previously discussed with respect to earlier embodiments are represented by the same reference numerals. In addition to these previously discussed elements, FIG. 9's embodiment also includes a pair of current subtracting transistors (902, 904), each of which is selectively controlled via a current subtraction signal (CS). Each current subtracting transistor acts as a current mirror which is fed by a voltage signal CS representing a precharge current ($I_{pre}$). Together with transistors 707, 712, the current subtracting transistors (902, 904) make up first and second variable current shunts 906, 908. These variable current shunts (906, 908) selectively shunt currents ($I_{CELL}$, $I_{REF}$, respectively) occurring during the start of a read cycle to ease integration.

The variable current shunts 906, 908 can exhibit both a digital mode and an analog mode. As discussed in more detail below, the digital mode is driven by a Pre-Discharge (PD) signal, while the analog mode is controlled by the current subtract signal (CS), which corresponds to the precharge current ($I_{Pre}$) which is derived in a separate circuit 940.

In the digital mode, the transistors 707, 712 are enabled by asserting the PD signal prior to the start of a read operation, which discharges all charge from the integration capacitors 706, 711.

Then, in the beginning of the read cycle, the current subtracting transistors (902, 904) are operated in analog fashion to subtract dynamic portion of currents ($I_{CELL}$, $I_{REF}$, respectively). By shunting unsettled power occurring during the start of read operations, the current subtracting transistors 902, 904, allow integration of reliable data from a memory cell to start earlier than previous solutions, thereby reducing read access times and potentially improving data processing time. The transistors 707, 712 can be conducting or non-conducting while the current subtracting transistors 902, 904 are operating in analog fashion, depending on the amount of current to be shunted.

For purposes of completeness, FIG. 9's circuit illustrates one manner in which the differential sense amp 900 can be coupled to memory cells within a memory array, wherein the memory cells are arranged in a series of M+1 rows and N+1 columns. Along a given row, a wordline extends therealong and is coupled to cells of the row to allow access to cells thereon. For example, memory cells 0-0 through N-0 are coupled to WL0 and can be selectively accessed by activation of wordline WL0. While a wordline is activated, data can be written to or read from the cells of the row via bitlines BL0-BLN. For example, to read data from cell 0-0, WL0 is asserted, and Sel0 is concurrently asserted, such that BL0 (Cell 0-0) and BL0' (RefCell0) are concurrently coupled to the differential sense amplifier 900. As will be appreciated in more detail below, this allows the differential sense amplifier to discern what data state is stored in Cell 0-0.

It will be appreciated that the bitline for each column of memory cells can be coupled to its own individual sense amplifier, or that multiple bitlines can share a single sense amplifier, depending on what tradeoff choices a designer makes between performance and cost. Typically, including more sense amplifiers tends to improve read throughput, although this also tends to increase cost due to the additional silicon used to form these additional sense amplifiers.

A read operation 1000 carried out on with FIG. 9's differential sense amp 900 is now described in more detail with respect to a series of example waveforms depicted in FIG. 10, which collectively read data from Memory Cell 0-0 of FIG. 9. For purposes of simplicity, not all signals are illustrated, and the signals illustrated are merely examples. Actual signals may vary widely from those illustrated, depending on the implementation.

Prior to the beginning of read operation 1000, the pre-discharge signal (PD) is activated at time 1002. This discharges the integration capacitors 706, 711, causing the voltage difference between Vcell and Vref to be set to an initial value (e.g., a initial value of zero volts between Vcell and Vref).

Next, at time 1004, the read operation 1000 begins when Sel0 and typically WL0 are activated, thereby coupling bitline BL0 of Memory Cell-0-0 to a first Sense Amp input, and coupling bitline BL0' of RefCell0 to a second Sense Amp input. When SEL0 and WL0 are activated, a charging current (e.g., Ipre+Icell) flows in the first input of the sense amp. This charging current corresponds to the data state in Cell 0-0, and causes Vcell to increase correspondingly. A reference charging current also flows between RefCell0 and bitline BL0', causing Vref to increase correspondingly.

Notably, when the wordline WL0 and SEL0 are initially activated, the voltages at the cell terminals and hence Icell and Iref currents are unsettled. To compensate for this unsettled current, the current subtract signal (CS) is selectively applied to current subtracting transistors (e.g., 902, 904 in FIG. 9) in an analog fashion. Thus, the gate voltage applied to these transistors is greater than VSS, but less than VDD, and tends to move in a time-varying fashion. In previous implementations where CS was not included, memory devices may have waited until a time when the currents Icell, Iref were settled (e.g., at time 1006) before starting integration. By allowing integration to start earlier, the CS signal can improve read times relative to previous solutions.

At time 1006, after the initial in-rush of current has settled, the CS signal goes low (indicating Ipre is substantially zero at this time). Charge continues to build on the integrating capacitors 706, 711 during this time, as can be seen by 1008. (For purposes of simplicity, FIG. 10 depicts a linear integration slope between 1004 and 1010, although in reality a change in integration slope would exist over this region). Assuming Cell 0-0 stores a single binary bit of information (e.g., corresponding to either a logical "0" or a logical "1"), the voltage level of VCell is either relatively high (e.g., a "1" data state) or relatively low (e.g., a "0" data state) compared to the voltage of Vref. This is because the reference cell (e.g., RefCell 0 in FIG. 9) stored an intermediate amount of charge that falls between the two charges of the binary state.

At time 1010, Vref reaches a predetermined stop voltage Vstop, and the tstop signal is asserted based on the comparison between Vref and Vstop. At this time, the sense amplifier analyzes the voltage difference between Vref and Vcell to determine the previous data state stored in Memory Cell 0-0. For example, a voltage difference of $\Delta V_1$ can indicate the stored data value was a "1", while a voltage difference of $\Delta V_0$ can indicate the stored data value was a "0".

In some embodiments, the PD signal is non-overlapping with the CS signal as indicated by reference number 1012. However, in other embodiments the PD signal may have a longer duration and may overlap with the CS signal as indicated by reference number 1014. All such embodiments are contemplated as falling within the scope of the present disclosure.

In some embodiments, the stop signal can also be used to reduce power consumption of the memory device and/or differential sense amplifier. For example, in some embodiments, the differential sense amplifier can close a current path based on the stop signal. In other embodiments, the differential sense amplifier can reduce a voltage provided by a voltage source based on the stop signal. Other power reduction schemes can also be implemented based on the stop signal. In this way, the stop signal can help reduce power consumption, and potentially extend the time for which users can use their mobile devices (e.g., cell phones, music players, digital cameras, laptops).

Although the example differential integrating sense amplifier topology in FIG. 7 is used to sense the programmed state of a memory cell in a flash memory array, various other embodiments of the invention will apply similar embodiments of the invention to other applications, including other sensors or instrumentation devices, communications systems and data storage devices, biomedical devices and sensors, and high speed analog-to-digital converters. Even though specific embodiments have been illustrated and described herein, it will be appreciated by those of ordinary skill in the art that any arrangement that achieve the same purpose, structure, or function may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. A differential sense amplifier, comprising:
   a first circuit connected to an input of the sense amplifier, the first circuit operable to provide a first time varying voltage signal;
   a second reference circuit to provide a second time varying voltage signal;
   a comparator operable to compare the first and second time varying voltage signals;
   wherein the differential sense amplifier comprises a self-timed circuit to determine a time during which the first and second voltage signals are compared.

2. The differential sense amplifier according to claim 1, wherein:
   the self-timed circuit is operable to determine the time during which the first and second voltage signals are compared based on when at least one of the first and second time varying voltage signals reach a predetermined stop voltage.

3. A differential sense amplifier, comprising:
   a first circuit to provide a first time-varying voltage, the first time-varying voltage indicative of a data state stored in a memory cell;
   a second circuit to provide a second time-varying voltage, the second time-varying voltage indicative of an intermediate data state associated with a reference cell or an equivalent reference current;
   a trigger circuit to selectively assert a stop signal at a stop time when the second time-varying voltage has a predetermined relationship with a predetermined stop voltage.

4. The differential sense amplifier of claim 3, further comprising:
   a comparator operable to determine the data state stored in the memory cell by evaluating a voltage difference between the first time varying voltage and the second time-varying voltage at approximately the stop time.

5. The differential sense amplifier according to claim 4, wherein the differential sense amplifier can reduce its power consumption based on the stop signal.

6. The differential sense amplifier according to claim 4, wherein the differential sense amplifier can close a current path based on the stop signal.

7. The differential sense amplifier according to claim 4, wherein the differential sense amplifier can reduce a voltage provided by a voltage source based on the stop signal.

8. The differential sense amplifier according to claim 4, wherein the first circuit further comprises:
   a first current source operable to supply charge indicative of data stored in the cell to a first current integration element; and
   a first variable current shunt element to selectively shunt current away from the first current integration element for a predetermined time near the start of a read operation.

9. The differential sense amplifier according to claim 8, wherein the first variable current shunt comprises:
   a number of transistors having their respective gates coupled to different control signals.

10. The differential sense amplifier according to claim 8, wherein the second circuit further comprises:
    a second current source operable to supply charge indicative of an intermediate data state stored in the reference cell to a second current integration element; and
    a second variable current shunt element to selectively shunt current away from the second current integration element for the predetermined time near the start of the read operation.

11. The differential sense amplifier according to claim 10, wherein the second current shunt element comprises:
    a number of transistors having their respective gates coupled to different control signals.

12. A method of reading a memory cell, comprising:
    providing a first time-varying voltage indicative of a data state stored in a memory cell;
    provide a second time-varying voltage indicative of a reference data state associated with a reference cell;
    selectively asserting a stop signal at a stop time when the second time-varying voltage has a predetermined relationship with a predetermined stop voltage; and
    determining the data state stored in the memory cell by evaluating a voltage difference between the first time varying voltage and the second time-varying voltage at approximately the stop time.

* * * * *